US009781857B2

(12) United States Patent
Jau et al.

(10) Patent No.: US 9,781,857 B2
(45) Date of Patent: Oct. 3, 2017

(54) HOT SWAPPABLE COMPONENT QUICK RELEASE

(71) Applicant: Quanta Computer Inc., Taoyuan (TW)

(72) Inventors: Maw-Zan Jau, Taoyuan (TW);
Chao-Jung Chen, Taoyuan (TW);
Chih-Ming Chen, Taoyuan (TW);
Chung-Chih Chen, Taoyuan (TW);
Chi-Fu Chen, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 0 days.

(21) Appl. No.: 14/833,560

(22) Filed: Aug. 24, 2015

(65) Prior Publication Data

US 2016/0081219 A1    Mar. 17, 2016

(30) Foreign Application Priority Data

Sep. 12, 2014    (TW) .............................. 103131596 A (51) Int. Cl.
*H05K 7/00* (2006.01)
*H05K 7/14* (2006.01)

(52) U.S. Cl.
CPC .................................. *H05K 7/1487* (2013.01)

(58) Field of Classification Search
None
See application file for complete search history.

(56) References Cited

U.S. PATENT DOCUMENTS 5,995,364 A * 11/1999 McAnally ............... G06F 1/187
361/679.31
6,530,551 B2 * 3/2003 Gan ........................ G06F 1/184
248/694

(Continued)

FOREIGN PATENT DOCUMENTS

JP      2005-327390      11/2005
TW      I220942           9/2004

(Continued)

OTHER PUBLICATIONS

First Office Action mailed in Japanese Application No. 2014-242076 on Nov. 17, 2015.

(Continued)

*Primary Examiner* — Courtney Smith
*Assistant Examiner* — Rashen E Morrison
(74) *Attorney, Agent, or Firm* — Nixon Peabody LLP; Eduardo J. Quinones (57) ABSTRACT

A server assembly including a housing having a slidable tray transitionable between an open configuration and a closed configuration. A plurality of tray bodies disposed in the slidable tray, each of the plurality of tray bodies configured to removably receive at least one component module. The plurality of tray bodies arranged in rows, one behind the other, thereby having an first tray body and a second tray body. The second tray body is transitionable between a loading configuration and stored configuration. The storing configuration, the second tray body is arranged adjacent to the first tray body such that the receiving assembly is inaccessible. The loading configuration, the second tray body is translated relative to the tray and the first tray body such that the receiving assembly is accessible.

12 Claims, 12 Drawing Sheets

(56) References Cited

U.S. PATENT DOCUMENTS

| | | | | |
|---|---|---|---|---|
| 6,580,603 B1* | 6/2003 | Resnick | G06F 1/187 | 312/223.1 |
| 6,611,424 B2* | 8/2003 | Huang | G11B 33/128 | 248/224.51 |
| 6,769,540 B2* | 8/2004 | Hsieh | G11B 33/128 | 206/307 |
| 6,788,542 B2* | 9/2004 | Rumney | H05K 7/1425 | 361/724 |
| 6,788,544 B1* | 9/2004 | Barsun | H05K 7/1421 | 361/727 |
| 6,795,309 B2* | 9/2004 | Hartung | G06F 1/184 | 248/27.1 |
| 6,826,055 B2* | 11/2004 | Mease | G06F 1/184 | 312/223.1 |
| 6,922,336 B2* | 7/2005 | Barsun | G06F 1/183 | 312/223.2 |
| 7,038,915 B2* | 5/2006 | King | H05K 7/1487 | 312/236 |
| 7,042,721 B2* | 5/2006 | Olesiewicz | G06F 1/187 | 312/223.2 |
| 7,307,835 B1* | 12/2007 | Barina | G06F 1/187 | 248/917 |
| 7,375,959 B2* | 5/2008 | Chang | G06F 1/184 | 312/223.2 |
| 7,394,660 B2* | 7/2008 | Hidaka | G11B 33/126 | 361/724 |
| 7,643,280 B2* | 1/2010 | Chen | G11B 33/123 | 361/679.33 |
| 7,724,543 B2* | 5/2010 | Ozawa | H04Q 1/02 | 361/729 |
| 7,822,311 B2* | 10/2010 | Stansbury | G02B 6/4452 | 175/50 |
| 8,054,620 B2* | 11/2011 | Roesner | G11B 33/128 | 312/223.2 |
| 8,164,896 B1* | 4/2012 | Wang | G06F 1/1658 | 361/679.33 |
| 8,922,987 B2* | 12/2014 | Lin | H05K 7/1489 | 312/223.1 |
| 9,070,419 B1* | 6/2015 | Zhu | H05K 7/1491 | |
| 9,265,173 B1* | 2/2016 | Jhang | G06F 1/187 | |
| 9,304,556 B2* | 4/2016 | Jau | G06F 1/18 | |
| 9,497,881 B2* | 11/2016 | Chen | H05K 7/1487 | |
| 2003/0202321 A1* | 10/2003 | Lin | G06F 1/187 | 361/679.33 |
| 2004/0184243 A1* | 9/2004 | Mease | G06F 1/184 | 361/725 |
| 2005/0157461 A1* | 7/2005 | Cauthron | H05K 7/1488 | 361/724 |
| 2005/0257232 A1* | 11/2005 | Hidaka | G11B 33/126 | 720/654 |
| 2005/0265004 A1* | 12/2005 | Coglitore | H05K 7/1488 | 361/724 |
| 2005/0270751 A1* | 12/2005 | Coglitore | H05K 7/1411 | 361/724 |
| 2007/0233781 A1* | 10/2007 | Starr | G11B 33/126 | 709/203 |
| 2008/0165486 A1* | 7/2008 | Chen | G06F 1/187 | 361/679.57 |
| 2013/0120927 A1* | 5/2013 | Wen | G06F 1/187 | 361/679.39 |
| 2013/0342990 A1* | 12/2013 | Jau | G06F 1/18 | 361/679.39 |
| 2014/0055959 A1* | 2/2014 | Manda | G11B 33/128 | 361/728 |
| 2014/0204525 A1* | 7/2014 | Pecone | H05K 13/00 | 361/679.33 |

FOREIGN PATENT DOCUMENTS

| | | |
|---|---|---|
| TW | M335915 | 7/2008 |
| TW | 201216828 A2 | 4/2012 |
| TW | M430122 U | 5/2012 |
| TW | M441186 U | 11/2012 |
| TW | I512438 B | 12/2015 |

OTHER PUBLICATIONS

English language summary of First Office Action mailed in Japanese Application No. 2014-242076 on Nov. 17, 2015.
English language translation of Abstract of JP 2005-327390.
Office Action mailed on Jul. 16, 2015 in Taiwanese Application No. 10420916990.
English Translation of Abstracts of Citations in Office Action mailed on Jul. 16, 2015 in Taiwanese Application No. 10420916990.
Summary of Office Action mailed on Jul. 16, 2015 in Taiwanese Application No. 10420916990.
TIPO Invalidation Proceeding No. 103131596N01 mailed Oct. 4, 2016, for Taiwan Pat. No. I512438.

* cited by examiner

HOT SWAPPABLE COMPONENT QUICK RELEASE

CROSS REFERENCE TO RELATED APPLICATIONS

This application claims priority to Taiwanese Application No. 103131596, filed Sep. 12, 2014, the contents of which are entirely incorporated by reference herein.

FIELD

The subject matter herein generally relates to a server device assembly. More specifically, the subject matter herein relates to hard disk arrangements for server device assemblies.

BACKGROUND

Known hard disk arrangements for computing devices, such as server device assemblies, allow so called hot-swappable capabilities. Hot-swappable means being able remove, insert, and/or replace hard disk without requiring the shutdown of the computer system. The ability to hot-swap components is particularly important to maintain or expand the server assembly without interrupting service. However, server device assemblies with industry standard size have limited space for manipulating components mounted therein without considerable disassembly of the server device assembly. Thus, the arrangement and number of hot-swappable components that can be utilized within a server device assembly is generally limited.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Server rack assemblies have industry standard sizing, known as a rack unit (1U), that limit the available space within a server device assembly. As demand for server space increases with the continued growth of the internet and cloud computing, the need for server device assemblies having more storage capacity within the same space constraints has increased.

The present disclosure is focused on increasing the hot swappable storage capacity within a server device assembly through the arrangement of storage modules within the server device assembly. Server device assemblies can have a plurality of storage modules disposed within a housing. The server device assembly has a defined width limited by the rack unit, therefore in order to increase capacity the plurality of storage modules can be arranged in rows, one behind the other, thereby increasing the quantity of storage modules that can be received within a server device assembly. The first row can be accessible from the front of the housing allowing insertion and/or removal of storage modules, and the second and subsequent rows can be transitionable so as to make each row accessible allowing insertion and/or removal of storage modules. The storage modules can be a Hard Disk Drive (HDD), Solid State Drive (SSD), or any combination thereof. The illustrated embodiment is only exemplary and a server device assembly can include more or less components than shown. While the exemplary embodiment discussed herein utilizes hard drives, the present disclosure relates to any component, such as fans, motherboards, processors, memory cards, or other components.

Figure 1:
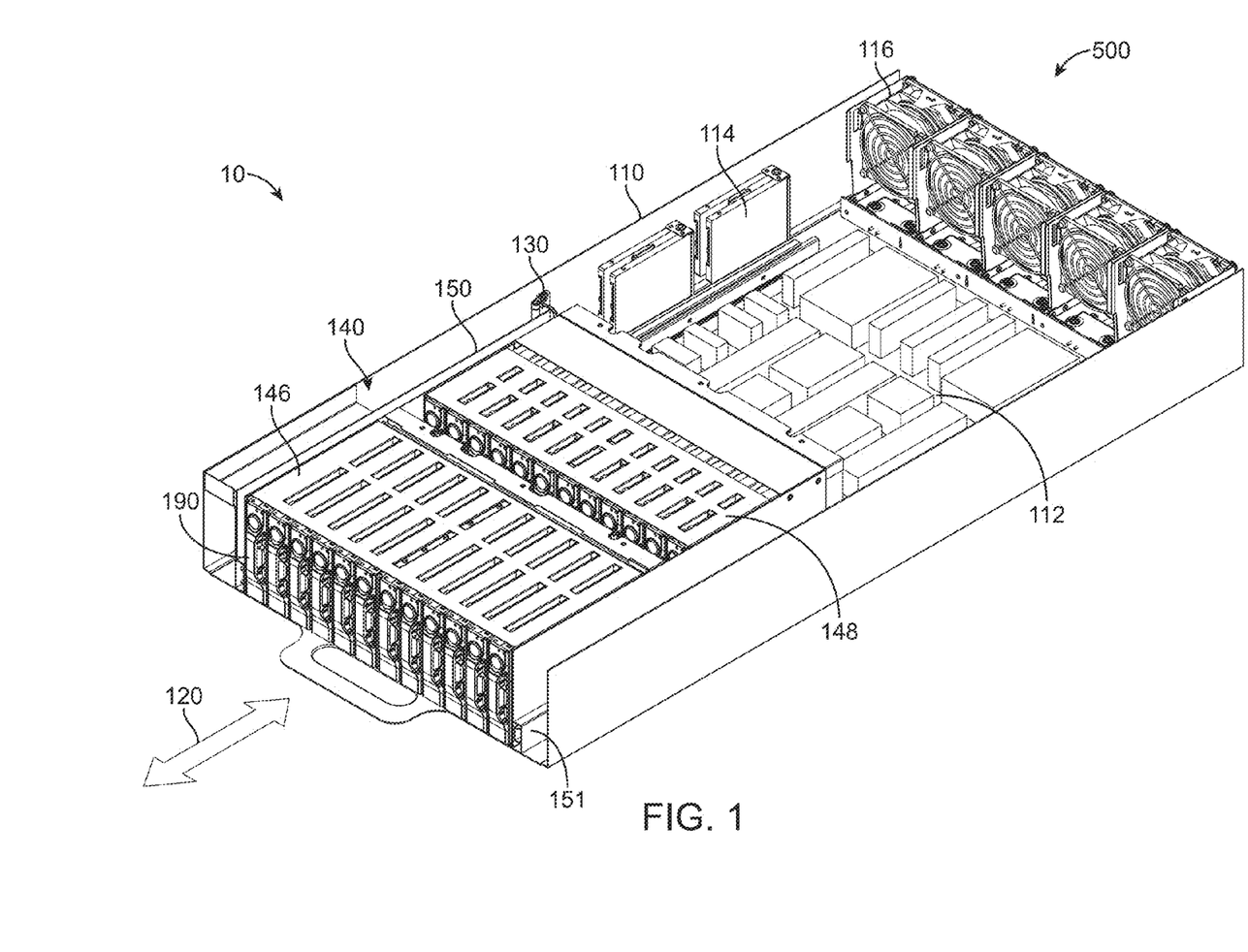
FIG. 1 is an isometric view of an exemplary embodiment of a server device assembly in a closed configuration.
Figure 2:
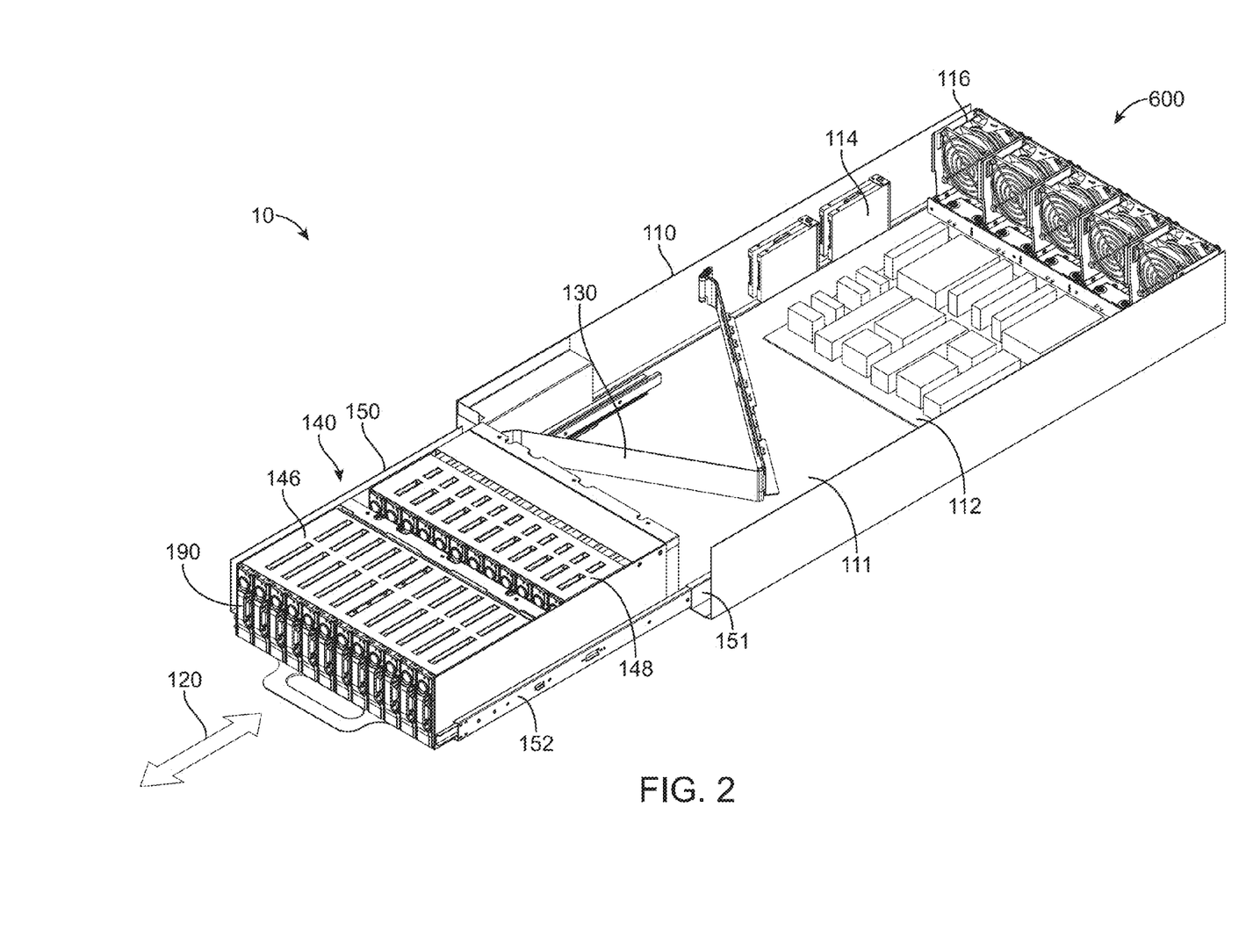
FIG. 2 is an isometric view of an exemplary embodiment of a housing of a server device assembly in an open configuration.

FIG. 1 illustrates an exemplary embodiment of a server device assembly in a closed configuration. FIG. 2 illustrates an exemplary embodiment of a server device assembly in an open configuration. A server device assembly 10 can have a housing 110 mountable within a server rack assembly (not shown). The housing 110 can receive various components including, but not limited to, a motherboard 112, at least one SSD 114, at least one fan 116, and a plurality of storage modules 190. The motherboard 112 can electrically couple one or more of the at least one Solid State Drive (SSD) 114, the at least one fan 116, and the plurality storage modules 190. In at least one embodiment, the server device assembly 10 can have more than one motherboard 112 electrically coupling the various components received within the housing 110 of the server device assembly 10.

The housing 110 can have a slidable tray 140 received therein and transitionable between a closed configuration 500, as shown in FIG. 1, and an open configuration 600, as shown in FIG. 2. The slidable tray 140 can form a tray 150 capable of receiving the plurality storage modules 190 therein. The plurality storage modules 190 can be arranged in rows, one behind the other, each row substantially aligned and parallel to the other. The tray 150 can receive a first tray body 160 and a second tray body 170. The first tray body 160 can be disposed directly in front of the second tray body 170 within the tray 150. The first tray body 160 forming a first row of storage modules 190 and the second tray body 170 forming a second row of storage modules 190. In at least one embodiment, the tray 150 can receive a third tray body 210 (shown in FIG. 7). In other embodiments, the tray 150 can receive more than three tray bodies.

The slidable tray 140 can be transitionable in a sliding direction 120 between the closed configuration 500 and the open configuration 600 (shown in FIG. 2). The sliding direction 120 can be along the longitudinal axis of the server device assembly 10.

In the closed configuration 500, the slidable tray 140 can be substantially received within the housing 110. A front surface of slidable tray 140 can be accessible while the slidable tray 140 is in the closed configuration 500. The first tray body 160 of the slidable tray 140 can be accessible for insertion and removal in the closed configuration 500.

In the open configuration 600, the slidable tray 140 can be substantially removed from the housing 110. The first tray body 160 and the second tray body 170 can be accessible when the slidable tray 140 is in the open configuration 600. In at least one embodiment, in the open configuration 600 the slidable tray 140 is completely removed from the housing 110. In other embodiments, in the open configuration 600 the slidable tray 140 is partially removed from the housing 110, but still provides access to the first tray body 160 and the second tray body 170.

The slidable tray 140 can be coupled to the motherboard 112 by a retractable cable 130. The retractable cable 130 can allow the slidable tray 140 to remain electrically coupled to the motherboard 112 and other components of the server device assembly 10 regardless of whether the slidable tray 140 is in the closed configuration 500 or the open configuration 600. The continuous electrical coupling provided by the retractable cable 130 allows the plurality of storage modules 190 to be inserted, removed, and replaced without shutting down or interrupting the server device assembly 10. In at least one embodiment, the retractable cable 130 can be a rigid cable that extends as the slidable tray 140 is withdrawn from the housing 110. The rigid cable can be disposed on either side, or along the back surface of the tray 150 when in the closed configuration 500. In other embodiments, the retractable cable 130 can be flexible and roll and/or fold into a defined storage space. The flexible cable can have a biasing mechanism to retract the cable in the defined space when transitioning the slidable tray 140 from the open configuration 600 to the closed configuration 500. The slidable tray 140 coupled to the tray 150 by slide 151. One surface of slide 151 can be engaged with a wall of the housing 110 or of the tray 150 and another surface of slide 151 can engage with slider 152. In at least one embodiment, slide 151 and slider 152 are longitudinally shaped rails engaged with one another to allow the slidable tray 140 to slide relative to the housing 110. In other embodiments, one of the slide 151 and slider 152 can be a protrusion and the other of the slide 151 and slider 152 can be a groove capable of slidably receiving the protrusion.

As can be appreciated in FIG. 1, the slidable tray 140 can receive a plurality of storage modules 190 arranged in two rows, one behind the other. The first row can be accessible when the slidable tray is in the closed configuration 500 allowing each of the plurality of storage modules 190 to be removed or replaced without powering down the server device assembly 10. Each row of the tray 150 can have a roof 146, 148 to enclose the plurality of storage modules 190. The housing 110 can also have one or more SSDs 114 coupled to the motherboard 112. A plurality of fans 116 can exhaust heat from the server device assembly and be coupled opposite end the plurality of storage modules 190.

The server device assembly 10 can be transitioned to the open configuration 600 by moving the slidable tray 140 away from the housing 110 in the sliding direction 120. The slidable tray 140 can have a handle 141 to assist with transitioning the slidable tray 140 between the closed configuration 500 and the open configuration 600. As can be appreciated in FIG. 2, the slidable tray 140 and tray 150 are completely withdrawn from the housing 110 of the server device assembly 10.

In the illustrated embodiment, the retractable cable 130 is rigid, and hinged along the back surface of the tray 150. As can further be appreciated in FIG. 2, the slidable tray 140 can be slidingly engaged with the housing 110 via slide 151 and slider 152. The slide 151 and slider 152 are telescoping rails engaged with one another and coupled to the outer wall 155, 156 of the tray 150 and the inner wall of the housing 110.

Figure 3:
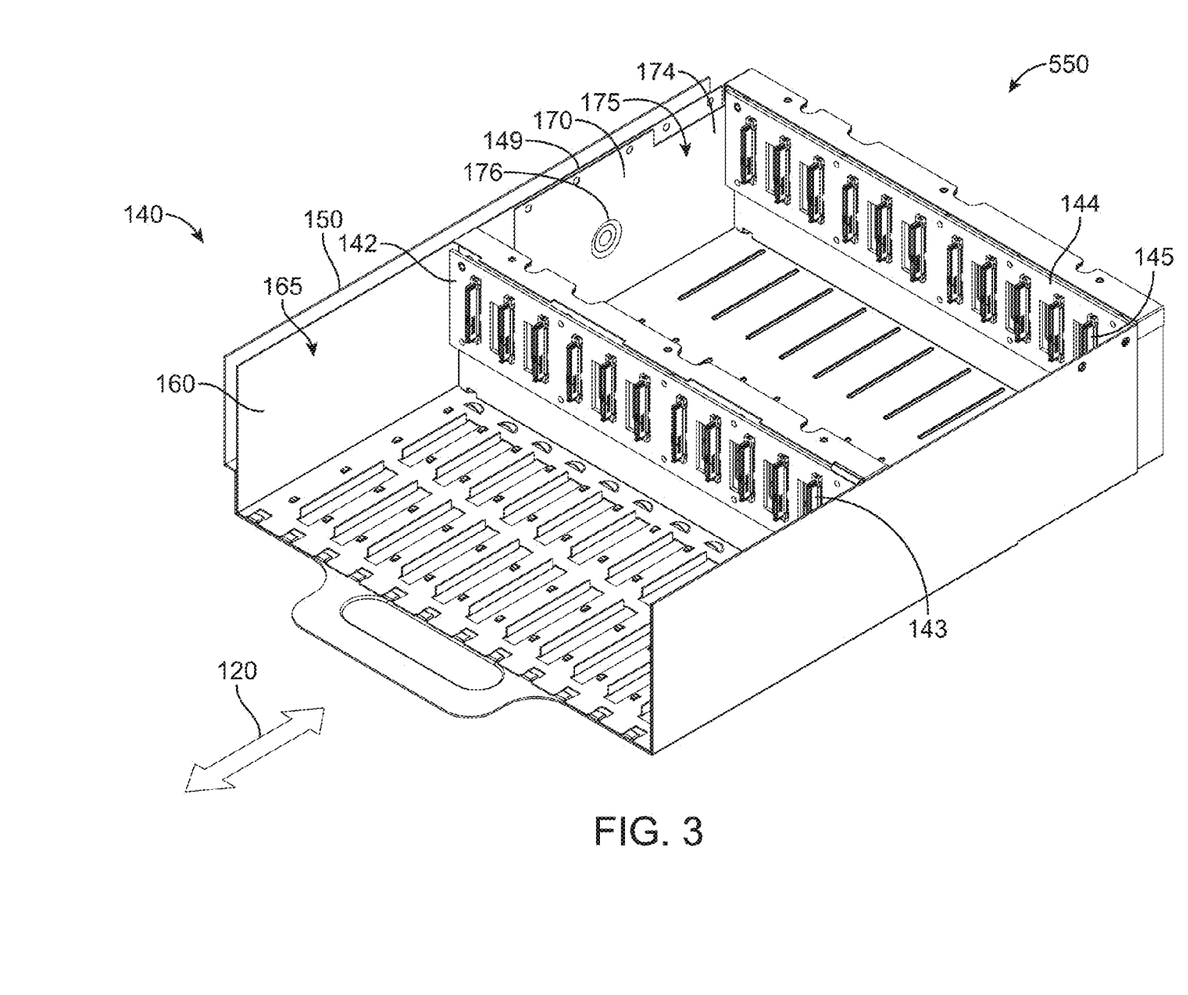
FIG. 3 is an isometric view of an exemplary embodiment of a slidable tray in a storing configuration.

FIG. 3 illustrates an exemplary embodiment of a slidable tray. The slidable tray 140 can have a first tray body 160 forming a first receiving space 165 and a second tray body 170 forming a second receiving space 175. The first receiving space 165 and the second receiving space 175 can each be configured to receive a plurality of storage modules 190 (shown in FIG. 4). The first receiving space 165 can have a back plate 142 having a plurality of connectors 143 and the second receiving space 175 can have a back plate 144 having a plurality of connectors 145. The plurality of connectors 143, 145 can electrically couple the plurality of storage modules 190 (shown in FIG. 4) to the motherboard 112 via the retractable cable 130.

Figure 4:
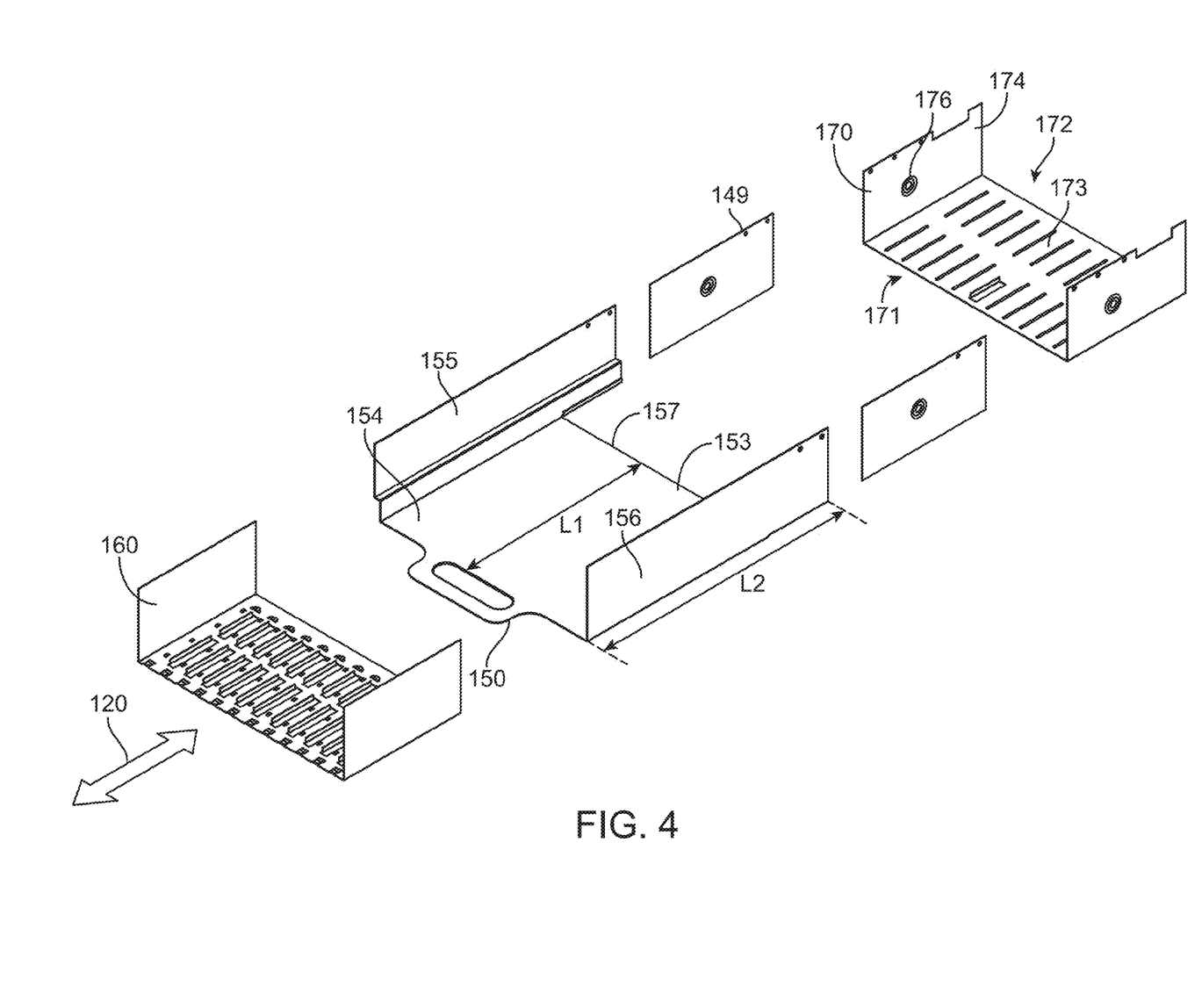
FIG. 4 is an exploded view of an exemplary embodiment of a slidable tray.

FIG. 4 illustrates an exploded view of an exemplary embodiment of a slidable tray. The slidable tray 140 can have a tray 150 having a first tray body 160 and a second tray body received therein. The second tray body 170 can be pivotable attached at a pivot hole 176 to transition between a storing configuration and a loading configuration. The pivot hole 176 can be coupled a pivot plate 149 secured to the tray 150. The tray 150 can have a through area 157 configured to allow the second end portion 172 and bottom surface 173 of the second tray body 170 to transition from the storing configuration to the loading configuration without impacting the bottom surface 154 of tray 150. The through area 157 can be formed by the bottom surface 154 having a length L1 smaller than the outer wall 155,156 length L2.

As can be appreciated in FIG. 3, the second tray body 170 can have a pivot hole 176 coupling the second tray body 170 with the slidable tray 140. The coupling can also include a pivot plate 149 disposed between the inner wall 174 of the second tray body 170 and the slidable tray 140. The pivot hole 176 can be substantially in the middle of the second tray body 170 or slightly forward of the middle. The placement of the pivot hole 176 can adjust the height at which the second tray body 170 extends above the slidable tray 140 when in the loading configuration, as shown below in FIG. 5.

Figure 5:
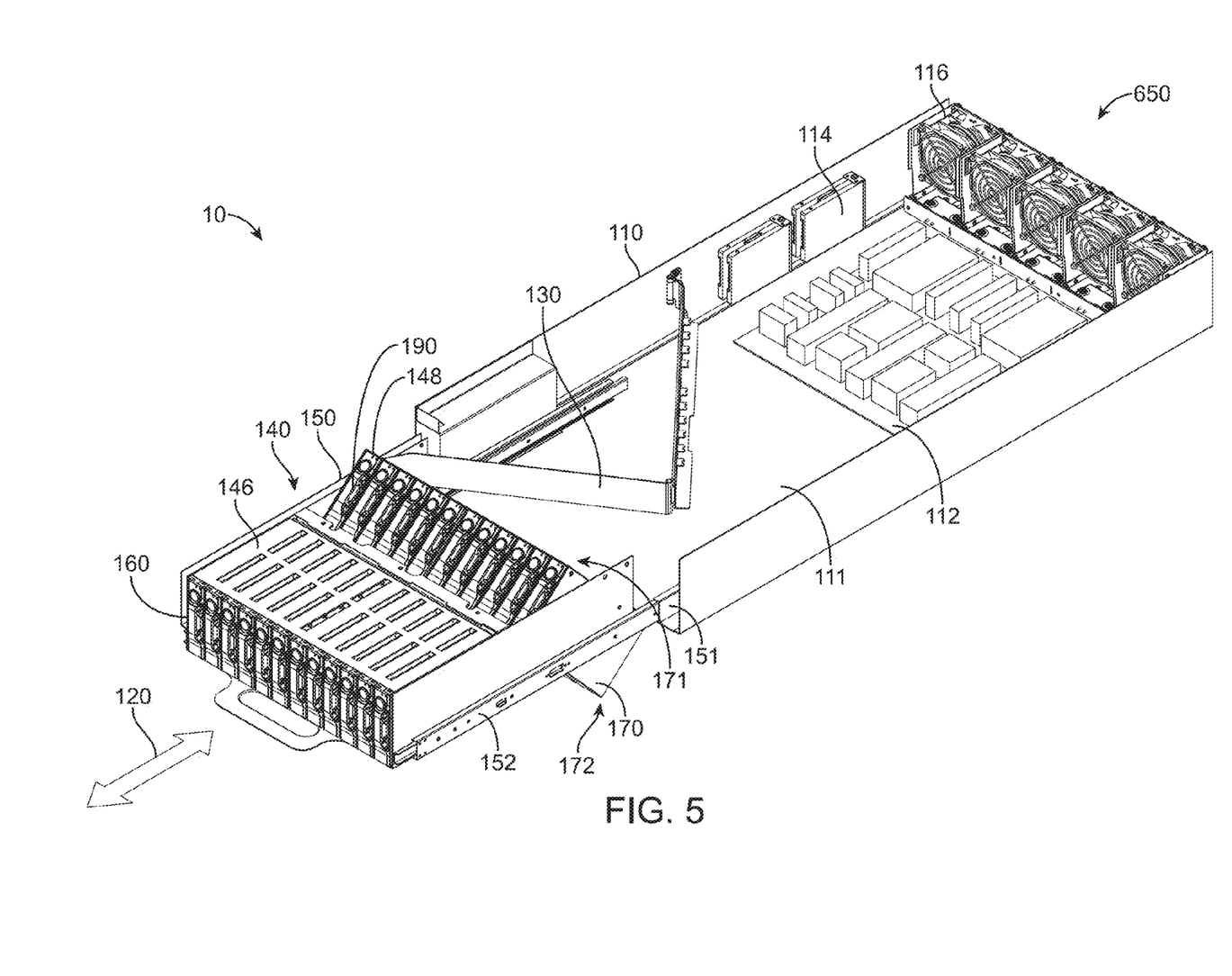
FIG. 5 is an isometric view of an exemplary embodiment of a housing of a server device assembly in a loading configuration.
Figure 6:
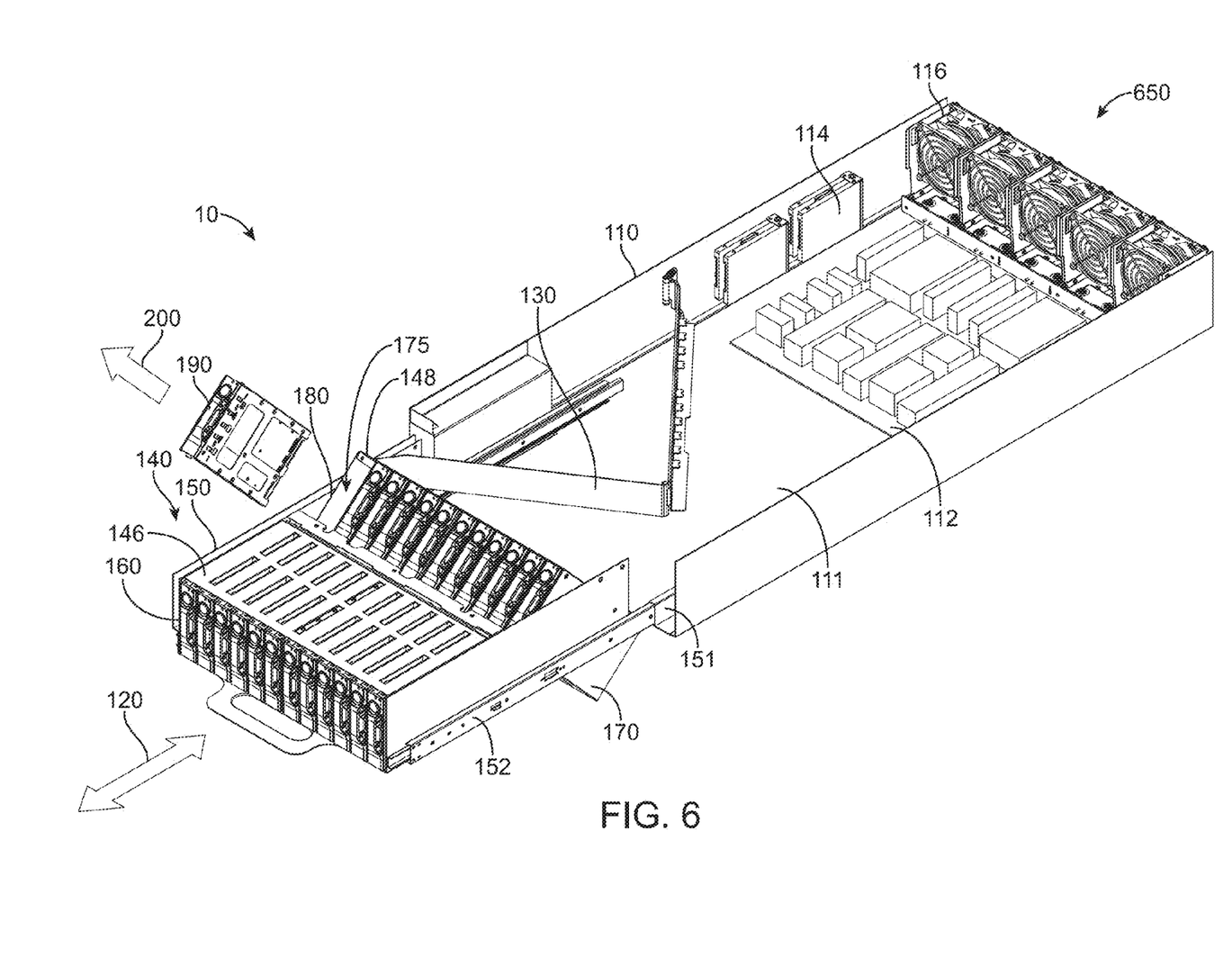
FIG. 6 is an diagrammatic view of an exemplary embodiment of a housing of a server device assembly in a loading configuration demonstrating removal of a component from a tray body.

FIG. 5 illustrates an exemplary embodiment of a server device assembly in a loading configuration. FIG. 6 illustrates a diagrammatic view of an exemplary embodiment of a server device assembly in a loading configuration. The second tray body 170 can be transitionable from a storing configuration 550 to a loading configuration 650 so as to provide access to the second tray body 170. In the storing configuration 550, the second tray body 170 can be in close proximity to the first tray body 160 so as to prevent access for installation, replacement, or removal of the storage modules 190. (Shown in FIG. 2). The second tray body 170 can be arranged adjacent to the first tray body 160 such that the storage module 190 is inaccessible. In the loading configuration 650, the second tray body 170 can be translatable relative to the first tray body 160 and housing 110 providing access to the second tray body. The second tray body 170 can translate relative to the slidable tray 140 and the first tray body 160, such that a front surface of the first tray body 160 faces the sliding direction 120 and a front surface of the second tray body 170 faces a detach direction 200. In the storing configuration 550, the front surface of the first tray body 160 and the front surface of the second tray body 170 faces substantially the same direction. The front surface can be considered to face a direction when the plane formed by the front surface is substantially perpendicular to the direction.

As can be appreciated in FIGS. 5 and 6, the second tray body 170 pivotably coupled to the tray 150 and is rotatable relative to the slidable tray 140. Rotation of the second tray body 170 allows storage modules 190 received therein to be removed in detach direction 200. The storage module 190 is received into the second tray body 170 at receiving mouth 180. As can further be appreciated in FIGS. 5 and 6, during the loading configuration 650 a second end portion 172 of the second tray body 170 extends below the first tray body 160.

In at least one embodiment, the pivotable coupling is a pin on one of the second tray body 170 and the slidable tray 140 and an aperture formed on the other of the second tray body 170 and the slidable tray 140 to receive the pin. The second tray body 170 rotatable about the pin, and a spring coupled to the pin biasing the second tray body 170 toward the loading configuration 650.

In other embodiments, the pivotable coupling comprises at least one linear actuator coupled to the second tray body 170 and the slidable tray 140 and configured to transition the second tray body 170 between the loading configuration 650 and the storing configuration 550.

In yet other embodiments, the pivotable coupling comprises a spring disposed between the bottom surface 173 of the second tray body 170 and the bottom surface 154 of the slidable tray 140, the spring configured to urge the second tray body 170 between the loading configuration 650 and the storing configuration 550.

In yet other embodiments, the pivotable coupling comprises a first gear on one of the second tray body 170 and the slidable tray 140 and a corresponding formed on the other of the second tray body 170 and the slidable tray 140. The first gear being spring biased to urge the second tray body 170 between the loading configuration 650 and the storing configuration 550.

In at least one embodiment, the pivotable coupling comprises a pin on one of the second tray body 170 and the slidable tray 140 and a groove formed on the other of the second tray body 170 and the slidable tray 140. The pin received in the groove and translatable within the groove between the loading configuration 650 and the storing configuration 550.

Figure 7:
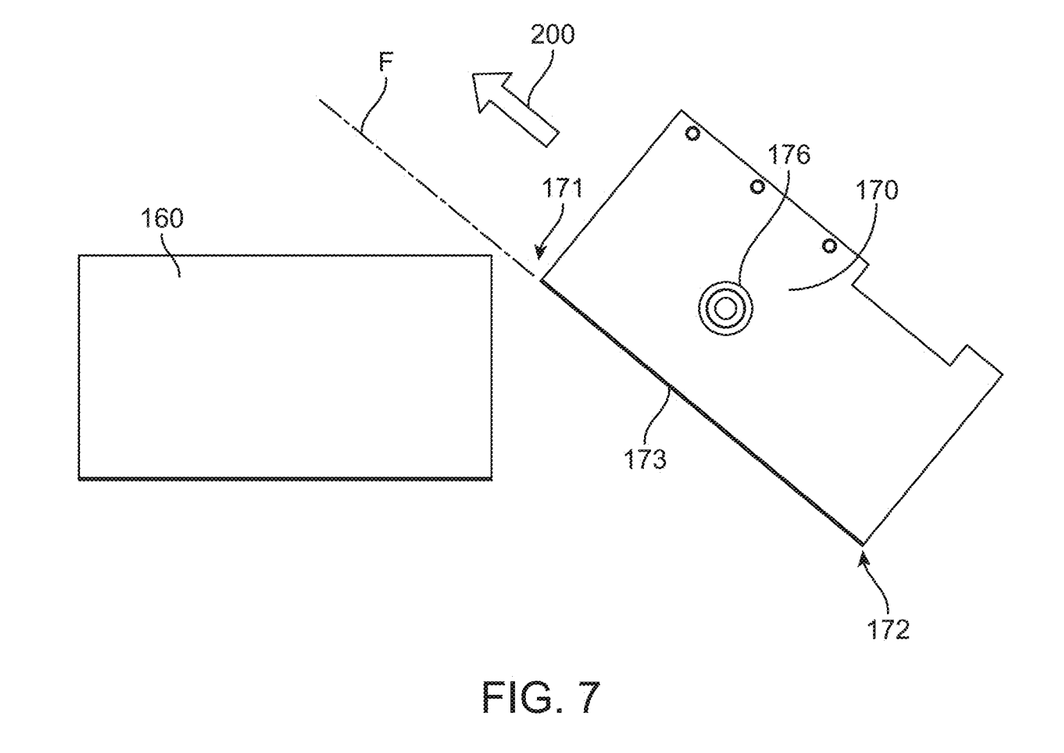
FIG. 7 is a diagrammatic side plan view of an exemplary embodiment having a first tray body and a second tray body in a loading configuration.
Figure 8:
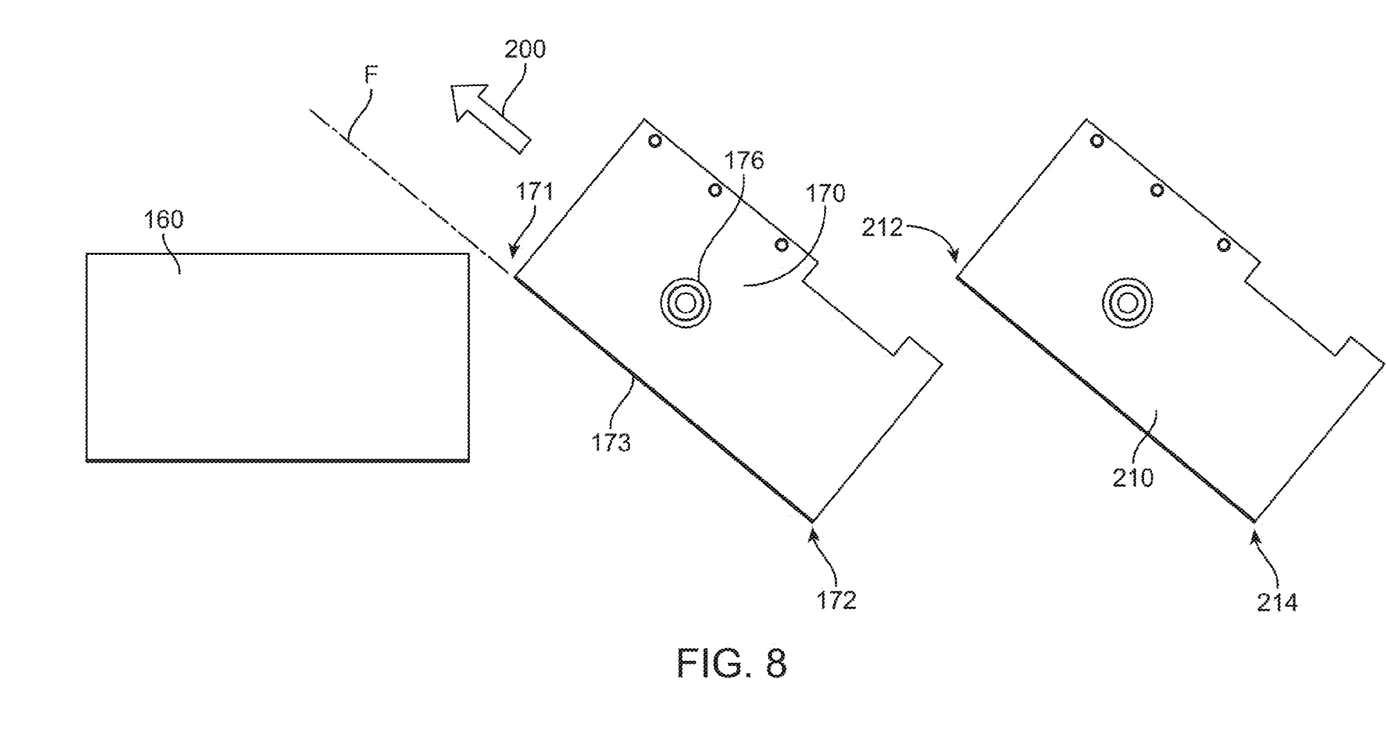
FIG. 8 is a side plan view of an exemplary embodiment of having a first tray body, a second tray body, and a third tray body in a loading configuration.

FIG. 7 illustrates diagrammatic side view of a first tray body and a second tray body. FIG. 8 illustrates a diagrammatic side view of a first tray body, a second tray body, and a third tray body. As can be appreciated in FIG. 7, the second tray body 170 is rotated about pivot hole 176 relative to the first tray body 160. In the loading configuration 650, a first end portion 171 of the second tray body 170 remain below the first tray body 160 while allowing imaginary extension plan F to extend beyond the first tray body 160 in the detach direction 200. The rotation allows a storage module 190 (shown in FIG. 6) to be detached from the second tray body 170 in detach direction 200 along imaginary extension plane F without interference with the first tray body 160. The second end portion 172 extends below the first tray body 160. The pivot hole 176 being substantially in the middle or just forward of the middle of the second tray body 170 limits the height required to rotate the second tray body while allowing imaginary extension plane F to not contact the first tray body 160. In other embodiments, the first tray body 160 can be translated upward, downward, or to either side of the server device assembly 10.

As can be appreciated in FIG. 8, the arrangement of a first tray body 160 and a second tray body 170 can include a third tray body 210. The rotation of the third tray body 210 can function substantially similar to that of the second tray body 170. A first end portion 212 of the third tray body 210 can remain below the first tray body 160 while the second end portion 214 of the third tray body 210 extends below the first tray body 160. In other embodiments, the additional tray bodies can be included within the server device assembly 10.

As shown above in FIGS. 1-8, the storing and loading configurations are based on a rotation or pivoting of a tray body with respect to the slidable tray. However, in alternative to or in combination with such rotation or pivoting and as discussed in more detail with respect to FIGS. 9-11, a loading configuration for one of the first tray body 160 and the second tray body 170 can involve a vertical translation. That is, having at least one of the first tray body 160 and the second tray body be translated above or below the other of the first tray body 160 and the second tray body 170 to provide access both tray bodies 160, 170 simultaneously. Thus a detach direction in such configurations can be substantially parallel for each of the first tray body 160 and the second tray body 170. Further, the translation can be either above or below depending on the location of the server device assembly 10 within the server rack assembly (not shown) and the preference of the technician. In other embodiments, the translation can be only above or only below based on the configuration of the slidable tray 140.

Figure 9:
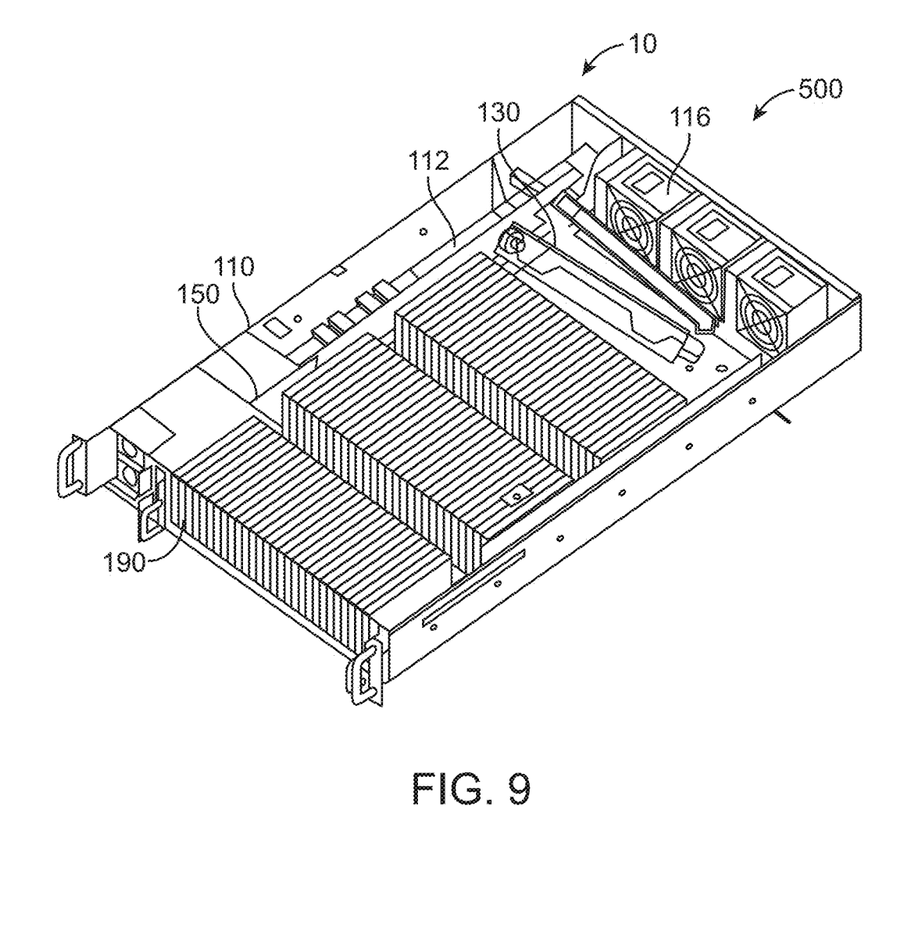
FIG. 9 is an isometric view of a second exemplary embodiment of a server device assembly in a closed configuration.

FIG. 9 illustrates a second exemplary embodiment of a server device assembly in a closed configuration. A server device assembly 10 can receive a plurality of storage modules 190 in a slidable tray 140 having a tray 150. The housing 110 can have a motherboard 112 coupling the plurality of storage modules 190 by a retractable cable 130 to the server device assembly 10. As can be appreciated in FIG. 9, the server device assembly is in a closed configuration 500 having the slidable tray 140 substantially received within the housing 110. The motherboard 112 can be disposed on one side of the housing 110 to accommodate a different size tray 150. The housing 110 can have one or more fans 116 disposed at the rear portion to exhaust heat generated by the server device assembly 10.

Figure 10:
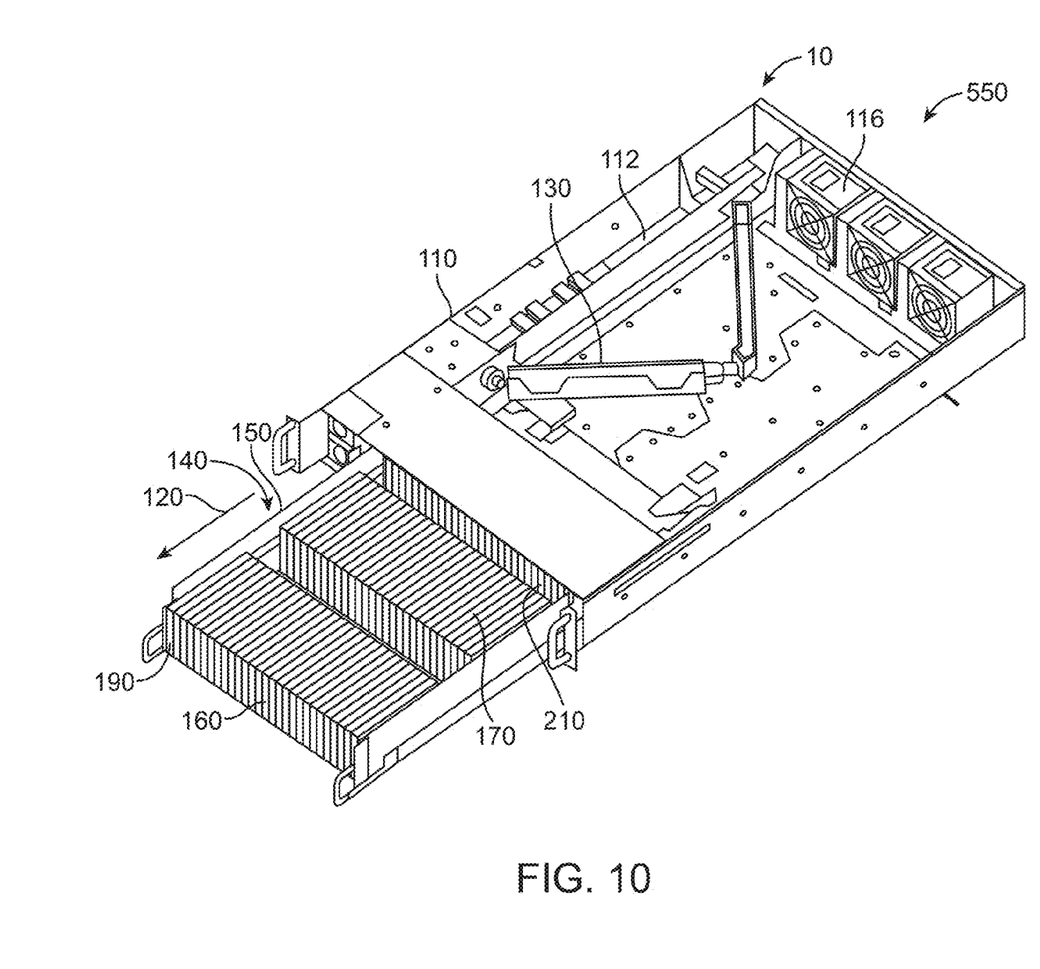
FIG. 10 is an isometric view of a second exemplary embodiment of a server device assembly in an open configuration.

FIG. 10 illustrates a second exemplary embodiment of a server device assembly in an open configuration. The slidable tray 140 of the server device assembly 10 can transition from the closed configuration 500 (shown in FIG. 9) to an open configuration 600. The open configuration 600 can have the slidable tray 140 at least partially removed from the housing 110. The slidable tray 140 can be displaced in the sliding direction 120 away from the housing 110 exposing the tray 150 of the slidable tray 140. As can be appreciated in FIG. 10, the tray 150 can have three tray bodies 160, 170, 210 disposed therein. Each tray body 160, 170, 210 can have a plurality of storage modules 190 received therein. The tray bodies 160, 170, 210 can be arranged one behind the other with a proximity such that only the first tray body 160 can be accessible in the closed configuration 500. As can further be appreciated in FIG. 10, the third tray body 210 can remain substantially within the housing 110 when the slidable tray 140 is in the open configuration 600. In other embodiments, the third tray body 210 can be substantially removed from the housing 110 when the slidable tray 140 is in the open configuration 600.

Figure 11:
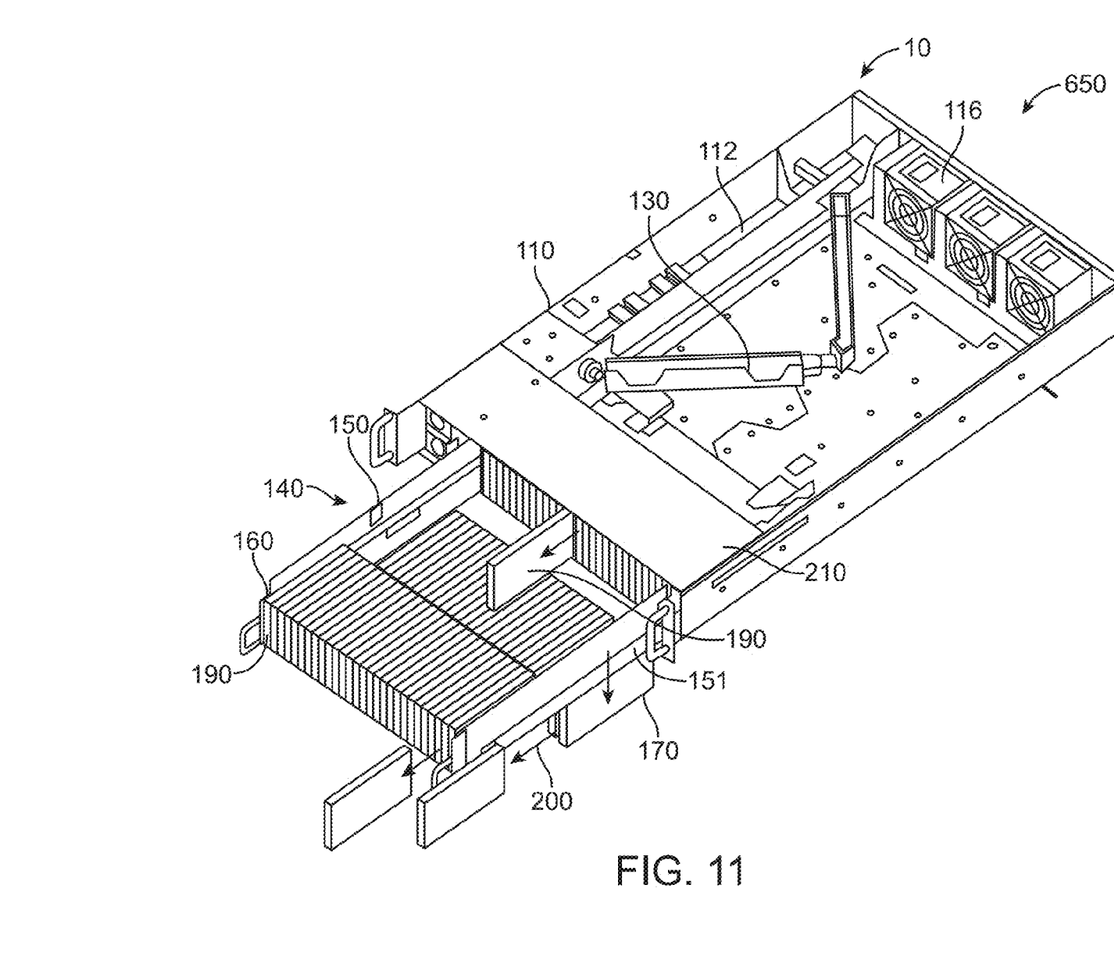
FIG. 11 is an isometric view of a second exemplary embodiment of a server device assembly in a loading configuration.

FIG. 11 illustrates a second exemplary embodiment of a server device assembly in a loading configuration. The slidable tray 140 of the server device assembly 10 can be transitionable from a storing configuration 550 (shown in FIG. 10) to a loading configuration 650. In the storing configuration 550, the second tray body 170 can be arranged adjacent to the first tray body 160 such that the storage module 190 is inaccessible. In the loading configuration 650, the second tray body 170 and third tray body 210 can be accessible allowing insertion and removal of storage modules 190. As can be appreciated in FIG. 11, the second tray body 170 can be displaced downward relative to the housing 110 providing access to the third tray body 210. The second tray body 170 can be accessed from below the first tray body 160. The displacement of the second tray body 170 in the loading configuration 650 provides access to each storage module 190 of the slidable tray 140 while still allowing electrical communication with the server device assembly. The second tray body 170 can optionally be displaced above the first tray body 160. The loading configuration 650 can provide a detach direction 200 that is substantially parallel for each of the first tray body 160, second tray body 170, and third tray body 210.

In at least one embodiment, the slidable tray 140 can have spring bias mechanism to automatically transition the tray 150 into a loading configuration 650 as the slidable tray 140 is removed from the housing 110. The spring bias can engage after the slidable tray 140 is displaced along the sliding direction 120 to an open configuration 600. In other embodiments, the slidable tray can have a gear arrangement to urge the transition from the open configuration 600 to the loading configuration 650.

In yet other embodiments, one of the slidable tray 140 and the first, second, or third tray body 160, 170, 210 can have a pin received in a grooved formed on the other of the slidable tray 140 and the first, second, or third tray body 160, 170, 210. The groove can have a storing position and a loading position where the pin is received in the respective arrangements.

The slidable tray 140 including the third tray body 210 can optionally be substantially completely removed from the housing 110 in the loading configuration 650. The third tray body 210 can displaced opposite the second tray body 170, above or below the first tray body 160, allowing access to each of the plurality of storage modules 190. The displacement of the third tray body 210 can also provide access to the interior space of the housing 110 for cleaning or maintenance without interrupting power and service of the server device assembly 10.

In at least one embodiment, the slidable tray 140 can be pivotable and translatable, such that a tray body 160, 170, 210 can be translated relative to the slidable tray 140 and then pivoted, or vice versa. The combination of translation and pivoting can increase accessibility depending on the location of the service device assembly 10 within a server rack assembly.

In other embodiments, the server device assembly 10 can include at least one tray body 160, 170, 210 in accordance with the first embodiment and at least one tray body 160, 170, 210 in accordance with the second embodiment disposed within a slidable tray 140.

Figure 12:
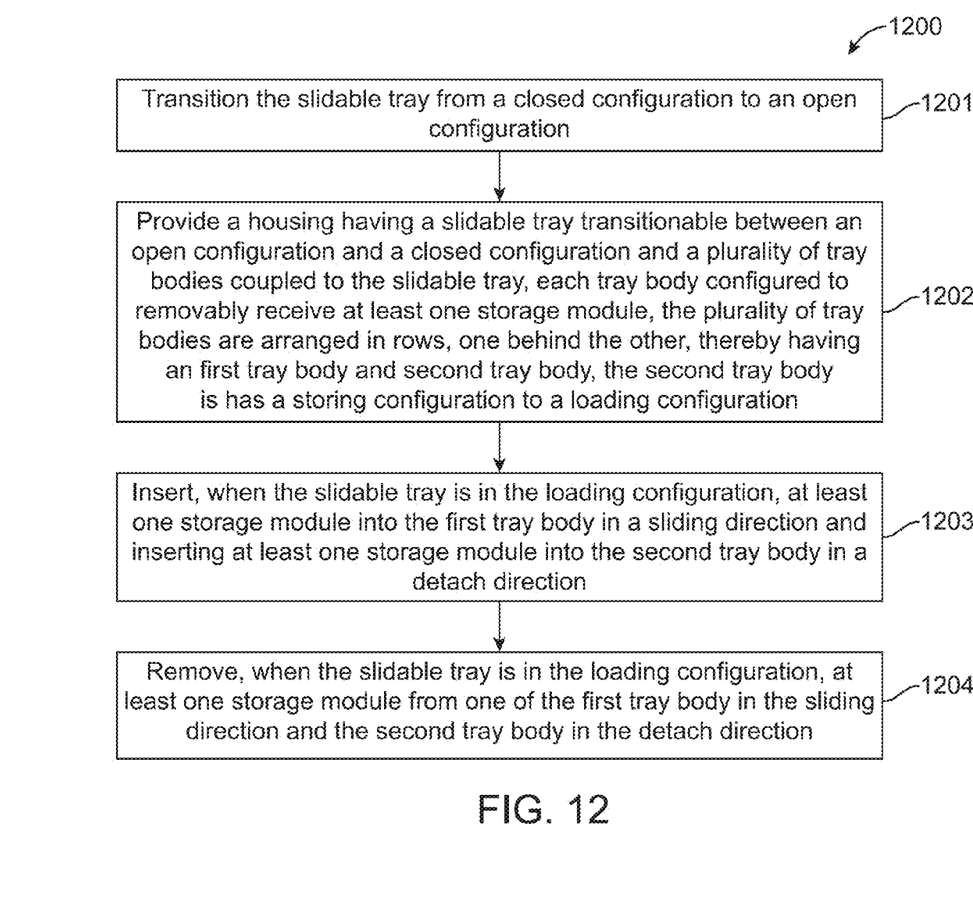
FIG. 12 is a flow chart of an exemplary method of a server device assembly.

Referring to FIG. 12, a flowchart is presented in accordance with an example embodiment. The example method 1200 is provided by way of example, as there are a variety of ways to carry out the method 1200. The method 1200 described below can be carried out using the configurations illustrated in FIGS. 1-11, for example, and various elements of these figures are referenced in explaining example method 1200. Each block shown in FIG. 12 represents one or more processes, methods or subroutines, carried out in the example method 1200. Furthermore, the illustrated order of blocks is illustrative only and the order of the blocks can change according to the present disclosure. Additional blocks may be added or fewer blocks may be utilized, without departing from this disclosure. The example method 1200 can begin at block 1201.

At block 1201, the server device assembly 10 can transition the slidable tray 140 from a closed configuration 500 to an open configuration 600.

At block 1202, the server device assembly 10 can provide a housing 110 having a slidable tray 140 transitionable between an open configuration 600 and a closed configuration 500 and a plurality of tray bodies 160, 170 coupled to the slidable tray 140. Each tray body 160, 170 configured to removably receive at least one storage module 190. The plurality of tray bodies 160, 170 arranged in rows, one behind the other, thereby having a first tray body 160 and a second tray body 170. In at least one embodiment, the slidable tray 140 can include a third tray body 210. In other embodiments, the slidable tray 140 can have more than three tray bodies.

At block 1203, the server device assembly 10 receiving, when the slidable tray 140 is in the open configuration 600, at least one storage module 190 into the first tray body 160 in a sliding direction 120 and receiving at least one storage module 190 into the second tray body in a detach direction 200. In the open configuration 600, the second tray body 170 translates relative to the slidable tray 140 and the first tray body 160, such that the front surface of the first tray body 160 faces the sliding direction 120 and the front surface of the second tray body 170 faces a detach direction 200. In the closed configuration 500, the front surface of the first tray body 160 and the front surface of the second tray body 170 face substantially the same direction.

At block 1204, the server device assembly 10 can remove, when the slidable tray 140 is in the open configuration 600, at least one storage module 190 from one of the first tray body 160 in the sliding direction 120 and the second tray body 170 in the detach direction 200.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A server device assembly comprising:
    a housing having a slidable tray having an open configuration and a closed configuration; and
    a plurality of tray bodies disposed in the slidable tray, each of the plurality of tray bodies configured to removably receive at least one component module;
    the plurality of tray bodies arranged in rows, one behind the other, providing at least a first tray body and a second tray body, the second tray body having a first end portion and a second end portion opposite the first end portion, the first end portion configured for removably receiving the at least one component module in the second tray body;
    wherein the second tray body is coupled to the tray via a pivotable coupling and is transitionable between a loading configuration and stored configuration;
    wherein the slidable tray comprises a bottom surface, wherein the bottom surface comprises a through area extending underneath at least portion of the second tray body, the through area configured for allowing the second end portion to pass through the bottom surface when the second tray body transitions to the loading configuration.

2. The server device assembly of claim 1, wherein in the open configuration the slidable tray is substantially removed from the housing and in the closed configuration the slidable tray is substantially received within the housing.

3. The server device assembly of claim 1, wherein the pivotable coupling comprises a pin on one of the second tray body and the slidable tray and an aperture formed on the other of the second tray body and the slidable tray to receive the pin, the second tray body rotatable about the pin, and a spring coupled to the pin biasing the second tray body toward the loading configuration.

4. The server device assembly of claim 1, wherein the pivotable coupling comprises a pin on one of the second tray body and the slidable tray and a groove formed on the other of the second tray body and the slidable tray, the pin received in the groove and translatable within the groove between the loading configuration and the storing configuration.

5. The server device assembly of claim 1, wherein the pivotable coupling comprises at least one linear actuator coupled to the second tray body and the slidable tray and configured to transition the second tray body between the loading configuration and the storing configuration.

6. The server device assembly of claim 1, wherein the pivotable coupling comprises a spring disposed between the bottom surface of the second tray body and the bottom surface of the slidable tray, the spring configured to urge the second tray body between the loading configuration and the storing configuration.

7. The server device assembly of claim 1, wherein the pivotable coupling comprises a first gear on one of the second tray body and the slidable tray and a corresponding formed on the other of the second tray body and the slidable tray, the first gear being spring biased to urge the second tray body between the loading configuration and the storing configuration.

8. The server device assembly of claim 1, wherein in the loading configuration, at least one component module in each of the plurality of tray bodies is accessible.

9. A method of using a server device assembly, the method comprising:
    providing a housing having a slidable tray transitionable between an open configuration and a closed configuration and a plurality of tray bodies coupled to the slidable tray, each tray body configured to removably receive at least one storage module, the plurality of tray bodies are arranged in rows, one behind the other, providing at least a first tray body and a second tray body, the second tray body having a first end portion and a second end portion, the first end portion configured for removably receiving the at least one storage module, and the second tray body being coupled to the tray via a pivotable coupling and transitionable between a storing configuration and a loading configuration;
    transitioning the slidable tray to the open configuration;
    transitioning, when the slidable tray is in the open configuration, the second tray body to the loading configuration; and
    inserting, when the second tray body is in the loading configuration, at least one storage module into the first tray body and inserting at least one storage module into the second tray body;
    wherein the slidable tray comprises a bottom surface, wherein the bottom surface comprises a through area extending underneath at least portion of the second tray body, the through area configured for allowing the second end portion to pass through the bottom surface when the second tray body transitions to the loading configuration.

10. The method of claim 9, further comprising removing, when the second tray body is in the loading configuration, at least one storage module from at least one of the first tray body and the second tray body.

11. The method of claim 9, further comprising:
    transitioning the second tray body to the storing configuration; and
    transitioning, when the second tray body is in the storing configuration, the slidable tray to the closed configuration.

12. The server device of claim 1, wherein the pivotable coupling comprises a pivot plate coupled to the slidable tray, and wherein the second tray body comprises a pivot hole for rotatably engaging the pivot plate.

* * * * *